US012716966B2

(12) United States Patent
Matsumoto

(10) Patent No.: US 12,716,966 B2
(45) Date of Patent: Aug. 25, 2026

(54) MAGNETIC FIELD MEASUREMENT APPARATUS

(71) Applicant: NEC Corporation, Tokyo (JP)

(72) Inventor: Kenta Matsumoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 392 days.

(21) Appl. No.: 18/242,094

(22) Filed: Sep. 5, 2023

(65) Prior Publication Data

US 2024/0085497 A1 Mar. 14, 2024

(30) Foreign Application Priority Data

Sep. 9, 2022 (JP) ................................ 2022-143776

(51) Int. Cl.
*G01R 33/032* (2006.01)
*G01R 33/00* (2006.01)

(52) U.S. Cl.
CPC ....... *G01R 33/032* (2013.01); *G01R 33/0041* (2013.01)

(58) Field of Classification Search
CPC .......................... G01R 33/032; G01R 33/0041
USPC ...................................................... 324/244.1
See application file for complete search history.

(56) References Cited

U.S. PATENT DOCUMENTS

2015/0130457 A1* 5/2015 Hokari ................. G01R 33/032 324/304
2016/0116553 A1* 4/2016 Kim ..................... G01R 33/032 324/304
2019/0293736 A1* 9/2019 Bulatowicz ............ G01C 19/62

FOREIGN PATENT DOCUMENTS

CN 108226820 A * 6/2018 ........... G01R 33/032
JP 2012-215499 A 11/2012

OTHER PUBLICATIONS

Zhang et al.; Translation of CN 108226820 A; Jun. 29, 2018; Translated by EPO & Google (Year: 2018).*

* cited by examiner

*Primary Examiner* — Alesa Allgood
*Assistant Examiner* — Rahul Maini
(74) *Attorney, Agent, or Firm* — Sughrue Mion, PLLC

(57) ABSTRACT

A magnetic field measurement apparatus according to the present invention includes: a gas cell in which an alkali metal atom is encapsulated; a light generation device configured to generate light to be radiated to the gas cell while controlling a polarization state thereof; an optical frequency modulation device configured to modulate a frequency of the light generated by the light generation device; a light detection device configured to measure an intensity and a polarization state of light transmitted through the gas cell; and a control device configured to determine a magnetic field value at a predetermined position inside the gas cell based on each of the intensity of the light and the polarization state of the light measured by the light detection device.

14 Claims, 8 Drawing Sheets

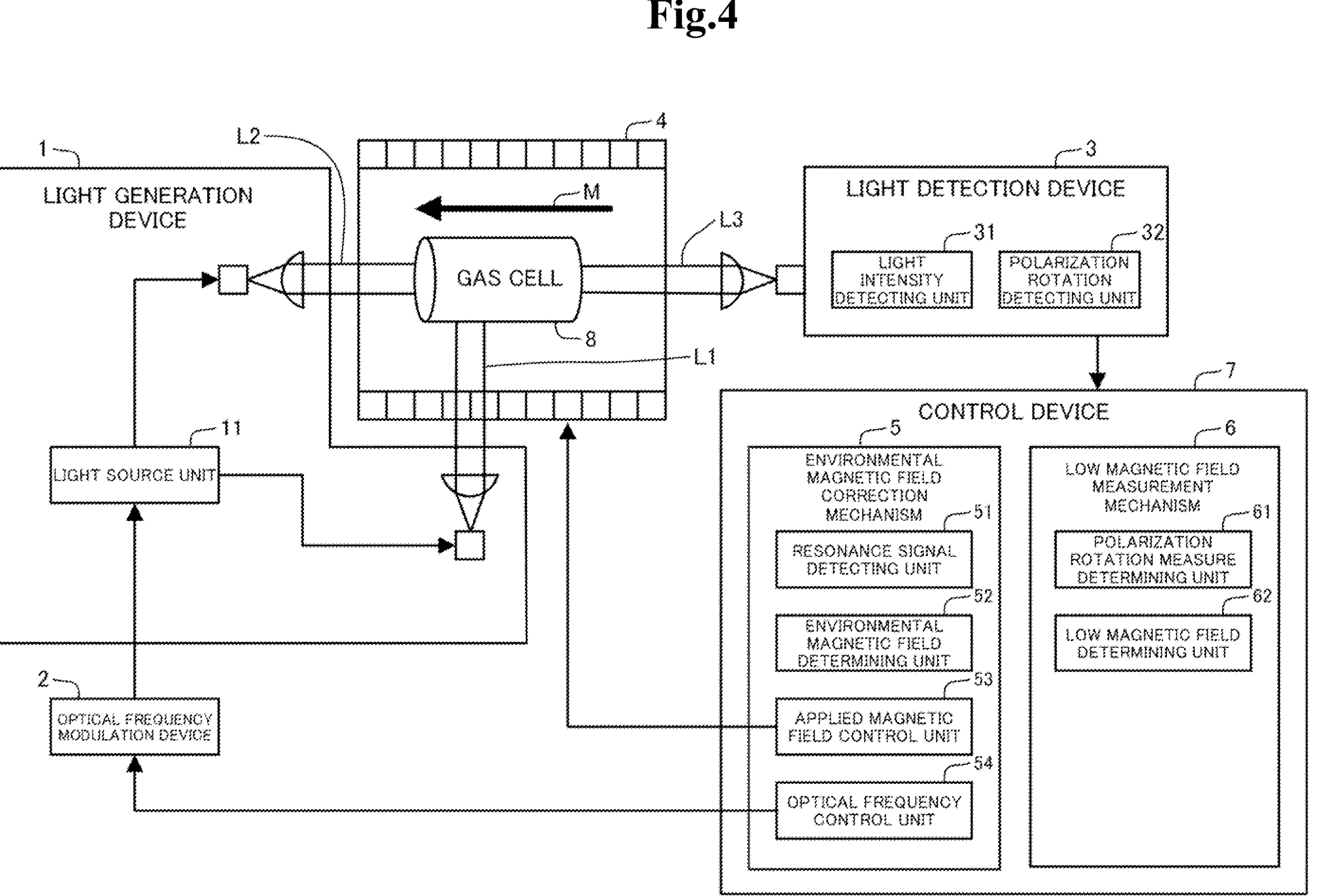
Fig.4
1
LIGHT GENERATION DEVICE
L2
4
M
GAS CELL
8
L1
L3
3
LIGHT DETECTION DEVICE
31
LIGHT INTENSITY DETECTING UNIT
32
POLARIZATION ROTATION DETECTING UNIT
11
LIGHT SOURCE UNIT
2
OPTICAL FREQUENCY MODULATION DEVICE
7
CONTROL DEVICE
5
ENVIRONMENTAL MAGNETIC FIELD CORRECTION MECHANISM
51
RESONANCE SIGNAL DETECTING UNIT
52
ENVIRONMENTAL MAGNETIC FIELD DETERMINING UNIT
53
APPLIED MAGNETIC FIELD CONTROL UNIT
54
OPTICAL FREQUENCY CONTROL UNIT
6
LOW MAGNETIC FIELD MEASUREMENT MECHANISM
61
POLARIZATION ROTATION MEASURE DETERMINING UNIT
62
LOW MAGNETIC FIELD DETERMINING UNIT

MAGNETIC FIELD MEASUREMENT APPARATUS

INCORPORATION BY REFERENCE

This application is based upon and claims the benefit of priority from Japanese patent application No. 2022-143776, filed on Sep. 9, 2022, the disclosure of which is incorporated herein in its entirety by reference.

TECHNICAL FIELD

The present invention relates to a magnetic field measurement apparatus.

BACKGROUND ART

An optically pumped magnetometer is an atomic magnetometer that radiates light to a spin-polarized alkali metal atomic gas, and measures the rotation measure of the plane of polarization to detect a magnetic field at the position of the atomic gas. An optically pumped magnetometer has the advantage of being able to detect the vector of a minute magnetic field, but has the problem of not being able to normally operate when a magnetic field at a measurement position is large. For this reason, an optically pumped magnetometer is generally used in a state where a disturbance magnetic field is removed, for example, by installing a large shield room. Meanwhile, in some cases, a magnetic field correction function is provided that detects a disturbance magnetic field and generates an applied magnetic field so as to cancel the disturbance magnetic field.

For example, Patent Literature 1 discloses a technique related to a magnetic field correcting device that measures a magnetic field using an optically pumped magnetometer and additionally has a magnetic field canceling function. Specifically, Patent Literature 1 discloses a technique for reducing an influence of a disturbance magnetic field by arranging two cells in each of which alkali metal atomic gas is encapsulated, serving as magnetic field sensor parts, at different distances from an object to be measured and generating an applied magnetic field so as to cancel the detected magnetic field in the cell farther from an object to be measured.

Patent Literature 1: Japanese Unexamined Patent Application Publication No. JP-A 2012-215499

However, the technique of Patent Literature 1 has a problem that a disturbance magnetic field with a strength exceeding the operable range of an optically pumped magnetometer cannot be measured and such a magnetic field cannot be corrected.

SUMMARY OF THE INVENTION

Accordingly, an object of the present disclosure is to provide a magnetic field measurement apparatus capable of solving the abovementioned problem that a disturbance magnetic field with a strength exceeding the operable range of an optically pumped magnetometer cannot be measured at a position to measure a magnetic field.

A magnetic field measurement apparatus as an aspect of the present invention includes: a gas cell in which an alkali metal atom is encapsulated; a light generation device configured to generate light to be radiated to the gas cell while controlling a polarization state thereof; an optical frequency modulation device configured to modulate a frequency of the light generated by the light generation device; a light detection device configured to measure an intensity and a polarization state of light transmitted through the gas cell; and a control device configured to determine a magnetic field value at a predetermined position inside the gas cell based on each of the intensity of the light and the polarization state of the light measured by the light detection device.

Further, a magnetic field measurement method as an aspect of the present invention is a magnetic field measurement method by a magnetic field measurement apparatus that includes a gas cell in which an alkali metal atom is encapsulated, a light generation device configured to generate light to be radiated to the gas cell while controlling a polarization state thereof, an optical frequency modulation device configured to modulate a frequency of the light generated by the light generation device, and a light detection device configured to measure an intensity and a polarization state of light transmitted through the gas cell. The magnetic field measurement method includes determining a magnetic field value at a predetermined position inside the gas cell based on each of the intensity of the light and the polarization state of the light measured by the light detection device.

With the configurations as described above, the present invention enables measurement of a disturbance magnetic field with a strength exceeding the operable range of an optically pumped magnetometer at a position to measure a magnetic field.

BRIEF DESCRIPTION OF DRAWINGS

FIG. 4 is a view showing a configuration of a magnetic field measurement apparatus in a first example embodiment;

EXAMPLE EMBODIMENT

First Example Embodiment

A first example embodiment of the present disclosure will be described with reference to FIGS. 1 to 5. First of all, a technique related to the present invention will be described with reference to FIGS. 1 to 3.

An optically pumped magnetometer is a device that measures a magnetic field with high accuracy using a gas of alkali metal atoms. An optically pumped device has a gas cell in which an atomic gas is encapsulated. Then, by radiating pump light containing circular polarization to the gas cell, the device can excite the encapsulated atoms and form a spin-polarized state having a different state distribution from the thermal equilibrium state. Furthermore, when probe light containing linear polarization is radiated to the spin-polarized atoms, the plane of polarization of the probe light rotates in accordance with the strength of a magnetic field at an atom position. Since the rotation measure of the plane of polarization is proportional to the strength of a magnetic field, a magnetic field can be measured by measuring the plane of polarization of light transmitted through the gas cell using a photodetector to determine the strength of a magnetic field at a predetermined position inside the gas cell according to the measured value. Since an optically pumped magnetometer causes rotation of the plane of polarization even for a very weak magnetic field, it is used for detection of a magnetic field with an extremely small strength such as a biomagnetic field. On the other hand, the disadvantage of an optically pumped magnetometer is that when a large magnetic field is generated at the position of the gas cell, the rotation measure of the plane of polarization cannot be accurately measured and measurement of the strength of the magnetic field is difficult.

When light containing two frequencies with a frequency difference corresponding to the hyperfine structure splitting of atom is radiated to a gas of alkali metal atoms that is the same as used in an optically pumped magnetometer, a quantum interference effect such that transition between the excited level and the ground level is suppressed (called CPT (Coherent Population Trapping) can be observed as an increase of the intensity of the transmitted light. The difference frequency of the radiation light when the quantum interference effect occurs is called a CPT resonance frequency. Since the energy level in the ground state varies due to application of a magnetic field, the strength of a magnetic field at a predetermined position inside the gas cell can be determined based on the observed CPT resonance frequency.

Figure 1:
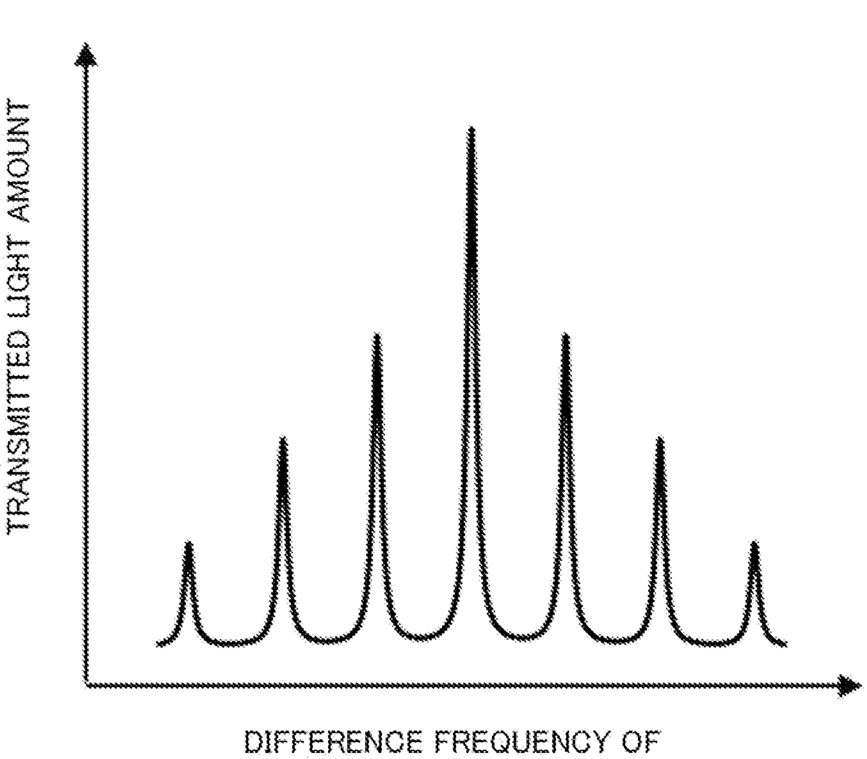
FIG. 1 is a view of a plurality of CPT resonances with different resonance frequencies appearing in a transmitted light spectrum.
Figure 2:
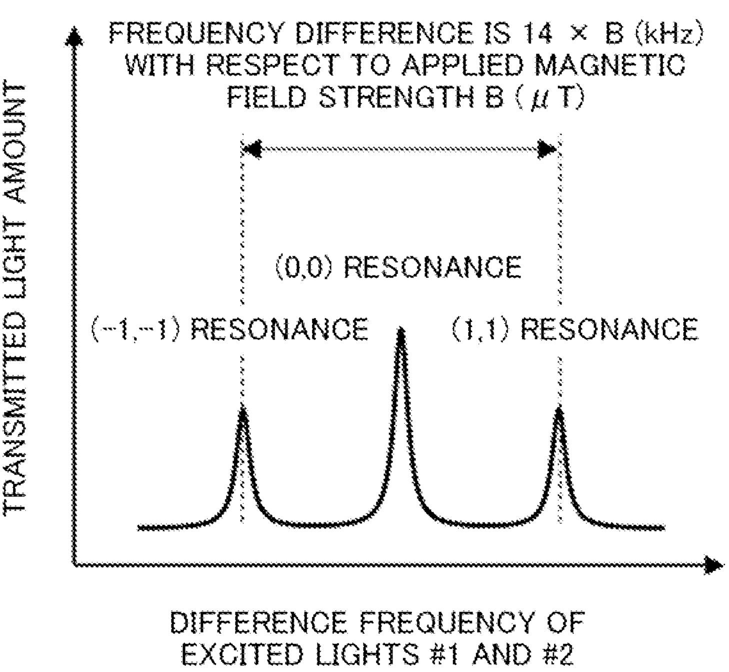
FIG. 2 is a view showing a method for detecting a difference in resonance frequency by observing a plurality of different CPT resonances.

In determination of magnetic field strength by the above method, the maximum value of a detectable magnetic field strength varies with a CPT resonance mode to be detected and the setting range of the difference frequency of the radiation light. FIG. 1 shows an example of the CPT resonance spectrum of Cs atoms detected in a state that a magnetic field is applied. By application of a magnetic field to the position of the gas cell, the ground level of Cs atoms splits into a plurality of magnetic sublevels. When the difference frequency of the radiation light is swept over a wide range in a state that a magnetic field is applied, CPT resonance signals corresponding to between the respective magnetic sublevels are detected as shown in FIG. 1. The interval between (1, 1) resonance frequency corresponding to the ground state with a magnetic sublevel of +1 and (−1, −1) resonance frequency corresponding to the ground state with a magnetic sublevel of −1 varies with the magnetic field strength. FIG. 2 shows in an enlarged manner the range of difference frequency over which the above CPT resonances are detected. By measuring the transmitted light spectrum while modulating the difference frequency of the radiation light, the interval between the CPT resonance frequencies can be determined.

Figure 3:
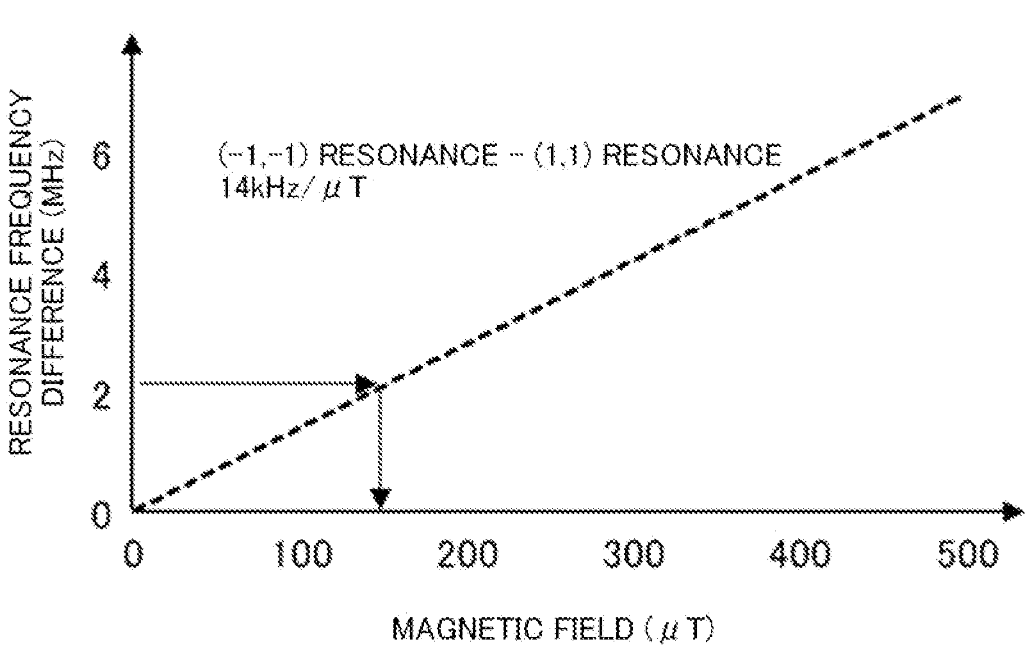
FIG. 3 is a view showing a magnetic field calculation method based on a difference in resonance frequency.

FIG. 3 shows the intervals of the resonance frequencies as the function of magnetic field strength. The resonance frequency difference varies substantially linearly with respect to the magnetic field strength, and the amount of the variation can be obtained from a known physical constant. For example, the interval between (1, 1) resonance frequency and (−1, −1) resonance frequency is approximately 14×B (kHz) under a magnetic field of B (μT). An optical frequency modulating unit is provided that allows the difference frequency of the radiation light to be set over a range of approximately 14 kHz and, if these two CPT resonance frequencies can be determined, a magnetic field of approximately 1 μT can be evaluated.

Although a method of using circularly polarized radiation light to evaluate the strength of a magnetic field based on the interval between (1, 1) resonance frequency and (−1, −1) resonance frequency has been described as an example herein, another detectable CPT resonance frequency may be used for evaluation of the strength of a magnetic field. Besides, the polarization state of the radiation light may be linear polarization.

In the example embodiment according to the present disclosure, as will be described later, in addition to an optically pumped magnetometer, an optical frequency modulating unit is provided to determine a magnetic field value by measuring the CPT resonance frequency, and further corrects the magnetic field at the position of the gas cell based on the determined magnetic field value. Consequently, it is possible to provide a magnetic field measurement apparatus that can perform measurement of a magnetic field even when there is a disturbance magnetic field with a strength exceeding the operable range of the optically pumped magnetometer.

[Configuration]

Next, a detailed configuration of the magnetic field measurement apparatus according to the first example embodiment will be described with reference to FIG. 4. The magnetic field measurement apparatus according to this example embodiment includes a light generation device 1, an optical frequency modulation device 2, a light detection device 3, a magnetic field application device 4, a control device 7 including an environmental magnetic field correction mechanism 5 and a low magnetic field measurement mechanism 6, and a gas cell 8 in which alkali metal atoms are encapsulated in a gaseous state.

The light generation device 1 generates pump light L1 containing circular polarization and probe light L2 containing linear polarization. These lights take optical paths so as to be radiated to the gas cell 8 as shown in FIG. 4. The light generation device 1 includes, for example, a light source unit 11 emitting light including a laser or the like. The pump light L1 and the probe light L2 necessary for the operation of the optically pumped magnetometer are realized by, for example, conveying light emitted from the light source unit 11, transmitting the light through a proper optical element such as a wave plate, and controlling the polarization state. Moreover, generation of radiation light L2 necessary for observing the quantum interference effect is realized by generating light containing two or more frequencies using the optical frequency modulation device 2.

The optical frequency modulation device 2 modulates the frequency of light generated by the light generation device 1. For example, by modulating the drive current of the laser included by the light source unit 11, the optical frequency modulation device 2 generates light containing sidebands whose frequency difference is almost equal to the hyperfine structure splitting of the atoms encapsulated in the gas cell 8. The difference frequency of the radiation light is controlled within a range that allows detection of a CPT resonance to be a reference for magnetic field evaluation. The range of control of the difference frequency of the radiation light required here varies with the strength of the magnetic field at the position of the gas cell 8. For example, in a case where (1, 1) resonance and (−1, −1) resonance are used as CPT resonances serving as the reference for magnetic field evaluation, the difference of the resonance frequencies varies in substantially proportional to the strength of the magnetic field at the position of the gas cell 8 as shown in FIG. 3. As an example, in a case where the strength of the magnetic field at the position of the gas cell 8 is expected to be approximately 100 μT, it is preferable to provide a mechanism capable of controlling the difference frequency of the radiation light in the range of 1400 kHz or higher, for example, in the range of approximately 1500 kHz.

The light detection device 3 includes a light intensity detecting unit 31 that measures the light intensity of transmitted light L3 transmitted through the gas cell 8, and a polarization rotation detecting unit 32 that measures the angle of the plane of polarization of the transmitted light L3.

The magnetic field application device 4 applies a static magnetic field M to a predetermined position inside the gas cell 8. The magnetic field application device 4 is implemented by, for example, arranging a solenoid coil so as to cover the gas cell 8. In this case, the direction and strength of a static magnetic field applied to a predetermined position inside the gas cell 8 can be controlled by regulating the direction and magnitude of an electric current applied to the solenoid coil using an applied magnetic field control unit of the control device 7.

The control device 7 is configured by an information processing device having an arithmetic logic unit and a memory unit. As shown in FIG. 4, the control device 7 includes the environmental magnetic field correction mechanism 5 and the low magnetic field measurement mechanism 6 that are constructed by execution of a program by the arithmetic logic unit. Moreover, the control device 7 stores, in the memory unit, variation characteristics such as the amount of variation of the resonance frequency difference of the CPT resonances due to the magnetic field, as shown in FIG. 3 described above.

The environmental magnetic field correction mechanism 5 includes, as shown in FIG. 4, a resonance signal detecting unit 51, an environmental magnetic field determining unit 52, an applied magnetic field control unit 53, and an optical frequency control unit 54. The environmental magnetic field correction mechanism 5 acquires a detection signal from the light intensity detecting unit 31 and based on this, calculates the resonance frequency of the quantum interference effect using the resonance signal detecting unit 51. Subsequently, the environmental magnetic field correction mechanism 5 determines an environmental magnetic field strength at a predetermined position inside the gas cell 8 using the environmental magnetic field determining unit 52 based on the calculated resonance frequencies and the variation characteristics of the resonance frequencies with respect to the magnetic field stored in the device. Then, based on the determined environmental magnetic field strength, the environmental magnetic field correction mechanism 5 regulates a control signal for the magnetic field applying device 4 using the applied magnetic field control unit 53. In addition, the environmental magnetic field correction mechanism 5 regulates a control signal for the optical frequency modulation device 2 so as to detect the resonance signal of the quantum interference effect using the optical frequency control unit 54. A detailed function of the environmental magnetic field correction mechanism 5 will be described in detail in the description of operation.

The low magnetic field measurement mechanism 6 includes a polarization rotation measure determining unit 61 and a low magnetic field determining unit 62 as shown in FIG. 4. Then, the low magnetic field measurement mechanism 6 acquires a detection signal from the polarization rotation measure detecting unit 61 and determines the rotation measure of the plane of polarization. Then, based on the rotation measure of the plane of polarization, the low magnetic field measurement mechanism 6 determines the strength of the low magnetic field at the position of the gas cell 8 using the low magnetic field determining unit 62. A detailed function of the low magnetic field measurement mechanism 6 will be described in the description of operation.

The gas cell 8 is composed of a transparent container of glass or the like, and alkali metal atoms are encapsulated therein in a gaseous state. The encapsulated alkali metal atoms may be, for example, any of cesium atoms, rubidium atoms, potassium atoms, and sodium atoms. Moreover, a buffer gas that does not affect the rotation of the plane of polarization and the quantum interference effect may be encapsulated for the purpose of suppressing state relaxation due to collision of the alkali metal atoms with the wall surface of the container. Moreover, a temperature control mechanism including a resistance heater may be provided for the purpose of controlling the saturated vapor pressure of the alkali metal atoms.

[Operation]

Figure 5:
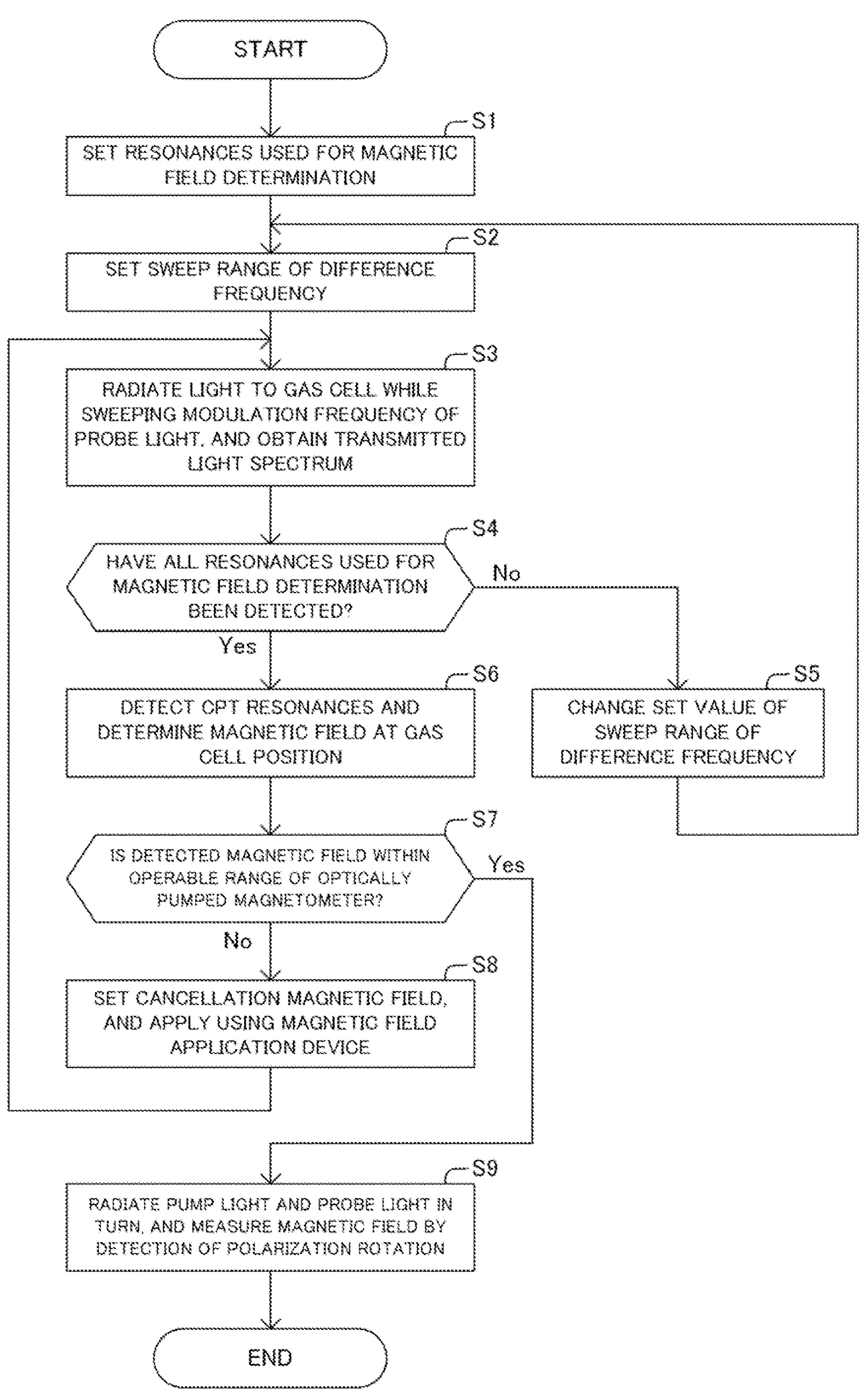
FIG. 5 is a flowchart showing operation of the magnetic field measurement apparatus in the first example embodiment.

Next, mainly with reference to FIG. 5, the operation of the above magnetic field measurement apparatus will be described. FIG. 5 is a flowchart showing the operation of the magnetic field measurement apparatus in the first example embodiment, and is a view for describing a magnetic field measurement method executed by the magnetic field measurement apparatus.

First, in detection of a quantum interference effect, the magnetic field measurement apparatus detects transmitted light while sweeping the difference frequency of the radiation light L2 using the optical frequency modulation device 2, and sets CPT resonances used for magnetic field evaluation (step S1). At this time, the magnetic field measurement apparatus stores the amounts of variations of the resonance frequencies of the CPT resonances due to the magnetic field. At least two CPT resonances with known variations of the resonance frequencies with respect to the magnetic field can be selected as the resonances used for magnetic field evaluation. For example, in a case where circularly polarized radiation light is radiated, (1, 1) resonance and (−1, −1) resonance can be selected. Moreover, for example, in a case where linearly polarized radiation light is radiated, (0, 2) resonance and (−2, 0) resonance can be selected.

Subsequently, the magnetic field measurement apparatus sets the sweep range of the difference frequency of the radiation light to a predetermined value (step S2). Preferably, the difference frequency is set in a range expected to include the resonance frequencies of all the resonances used for magnetic field evaluation. As an example, in a case where (1, 1) resonance and (−1, −1) resonance are selected as the resonances used for magnetic field evaluation, the difference between these resonance frequencies is 14×B (kHz), where B (μT) is the strength of a magnetic field parallel to the incident direction of the radiation light at the alkali atom position as shown in FIG. 3. The sweep range of the difference frequency of the radiation light is set to a wider range than the difference between (1, 1) resonance frequency and (−1, −1) resonance frequency. For example, in a case where the magnetic field strength at the gas cell position is expected to be approximately 100 μT, the difference between (1, 1) resonance frequency and (−1, −1) resonance frequency is expected to be approximately 1400 kHz, so that it is favorable to set the sweep range of the difference frequency of the radiation light to 1400 kHz or more.

Under the above conditions, the magnetic field measurement apparatus makes the radiation light L2 enter the gas cell 8 while sweeping the frequency difference of the radiation light L2, and detects the transmitted light L3 using the light detection device 3. The detected transmitted light spectrum is acquired by the environmental magnetic field correction mechanism 5 of the control device 7 (step S3). Then, CPT resonances are detected by the resonance signal detecting unit 51 of the environmental magnetic field correction mechanism 5. Here, it is determined whether all resonances to be used for magnetic field evaluation have been detected from the measured transmitted light spectrum (step S4) and, when there is a CPT resonance having not been detected (No at step S4), the sweep range of the difference frequency of the radiation light is changed to a range where all the CPT resonances are expected to be detected (step S5). As an example, the sweep range of the difference frequency of the radiation light is expanded. Alternatively, as an example, the sweep range of the difference frequency of the radiation light may be shifted to the lower frequency side or the higher frequency side. Then, the processing flow returns to step S2. Specifically, the sweep range of the difference frequency of the radiation light is changed, and measurement of a transmitted light spectrum is performed again.

On the other hand, when all the CPT resonances have been detected (Yes at step S4), the value of the magnetic field at a predetermined position inside the gas cell 8 is determined from the difference of the resonance frequencies of the resonances used for magnetic field evaluation by the environmental magnetic field determination unit 52 of the environmental magnetic field correction mechanism 5 (step S6). As an example, in a case where (1, 1) resonance and (−1, −1) resonance are selected as the resonances used for magnetic field evaluation, the difference between these resonance frequencies varies with the magnetic field as shown in FIG. 3. Assuming that the difference between these resonance frequencies is $\Delta f$ (Hz), the magnetic field value at the position of the gas cell 8 is determined to be $\Delta f/1400$ ($\mu T$). Here, it is determined whether or not the determined magnetic field value is within the operable range of the optically pumped magnetometer (step S7). The magnetic field values within the operable range of the optically pumped magnetometer are stored as values within a preset range.

In a case where the determined magnetic field value at the predetermined position inside the gas cell 8 is outside the operable range (No at step S7), the magnetic field measurement apparatus sets the strength of a magnetic field to be applied as a cancelling magnetic field, and regulates the set value of the magnetic field application device using the applied magnetic field control unit 53 (step S8). For example, in a case where the determined magnetic field value is beyond the operable range, an applied magnetic field cancelling the magnetic field is set to be larger so as to weaken the magnetic field at the position of the gas cell 8. Regulation of the applied magnetic field at the position of the gas cell 8 is realized by changing the value of an electric current applied to the solenoid coil. Then, the processing flow returns to S3, and measurement of a transmitted light spectrum is performed again.

On the other hand, after the regulation of the applied magnetic field described above, or when the magnetic field value determined at the position of the gas cell 8 is within the operable range without the regulation of the applied magnetic field (Yes at step S7), the magnetic field measurement apparatus ends the regulation of the magnetic field correction mechanism based on the observation of the quantum interference effect. Then, by conveying light emitted by the light source unit 11 whose optical frequency is not modulated and radiating the pump light L1 and the probe light L2 in turn, the magnetic field measurement apparatus acquires a detection signal using the polarization rotation measure detecting unit 61 of the low magnetic field measurement mechanism 6 to determine the rotation measure of the plane of polarization, and determines the strength of the low magnetic field at the position of the gas cell 8 based on the rotation measure of the plane of polarization using the low magnetic field determining unit 62 (step S9). At this time, the low magnetic field determination unit 62 determines a magnetic field value at a predetermined position inside the gas cell 8 based on the strength of the applied magnetic field set by the applied magnetic field control unit 53 and the strength of the low magnetic field measured by the low magnetic field determining unit 62. For example, a magnetic field value at a predetermined position inside the gas cell 8 is determined based on the set direction and strength of the applied magnetic field and the measured direction and strength of the low magnetic field.

As described above, the magnetic field measurement apparatus in this example embodiment can realize magnetic field measurement when there is a disturbance magnetic field with a strength exceeding the operable range of the optically pumped magnetometer at the position of the gas cell. Specifically, the magnetic field measurement apparatus operates as an optically pumped magnetometer that first radiates the pump light L1 containing a circular polarization component to the gas cell 8 to spin-polarizes the atoms within the gas cell 8, subsequently radiates the probe light L2 containing a linear polarization component to the gas cell to cause rotation of the plane of polarization according to the magnetic field strength inside the gas cell 8, and measures the rotation measure to determine the magnetic field value. In addition to this, the magnetic field measurement apparatus operates as a magnetic field measurement apparatus that causes the optical frequency modulation device 2 to regulate the light generation device 1 to generate the radiation light L2 containing at least two different frequency components and radiate to the gas cell 8, measures the transmitted light amount of the transmitted light L3, detects a quantum interference effect occurring when the difference between two frequencies among the frequencies of the radiation light is substantially equal to the hyperfine structure splitting of the ground level of the alkali metal atom, and determines the magnetic field value based on the spectrum of the quantum interference effect. Then, by including a mechanism that regulates the applied magnetic field strength at the position of the gas cell 8 based on the magnetic field strength determined from the spectrum of the quantum interference effect, the magnetic field measurement apparatus implements a magnetic field measurement apparatus that can perform measurement of a magnetic field even when there is a disturbance magnetic field with a strength exceeding the operable range of the optically pumped magnetometer.

Second Example Embodiment

A second example embodiment of the present disclosure will be described with reference to FIGS. 6 and 7. In this example embodiment, a different configuration from that of the magnetic field measurement apparatus in the first example embodiment will be mainly described.

[Configuration]

Figure 6:
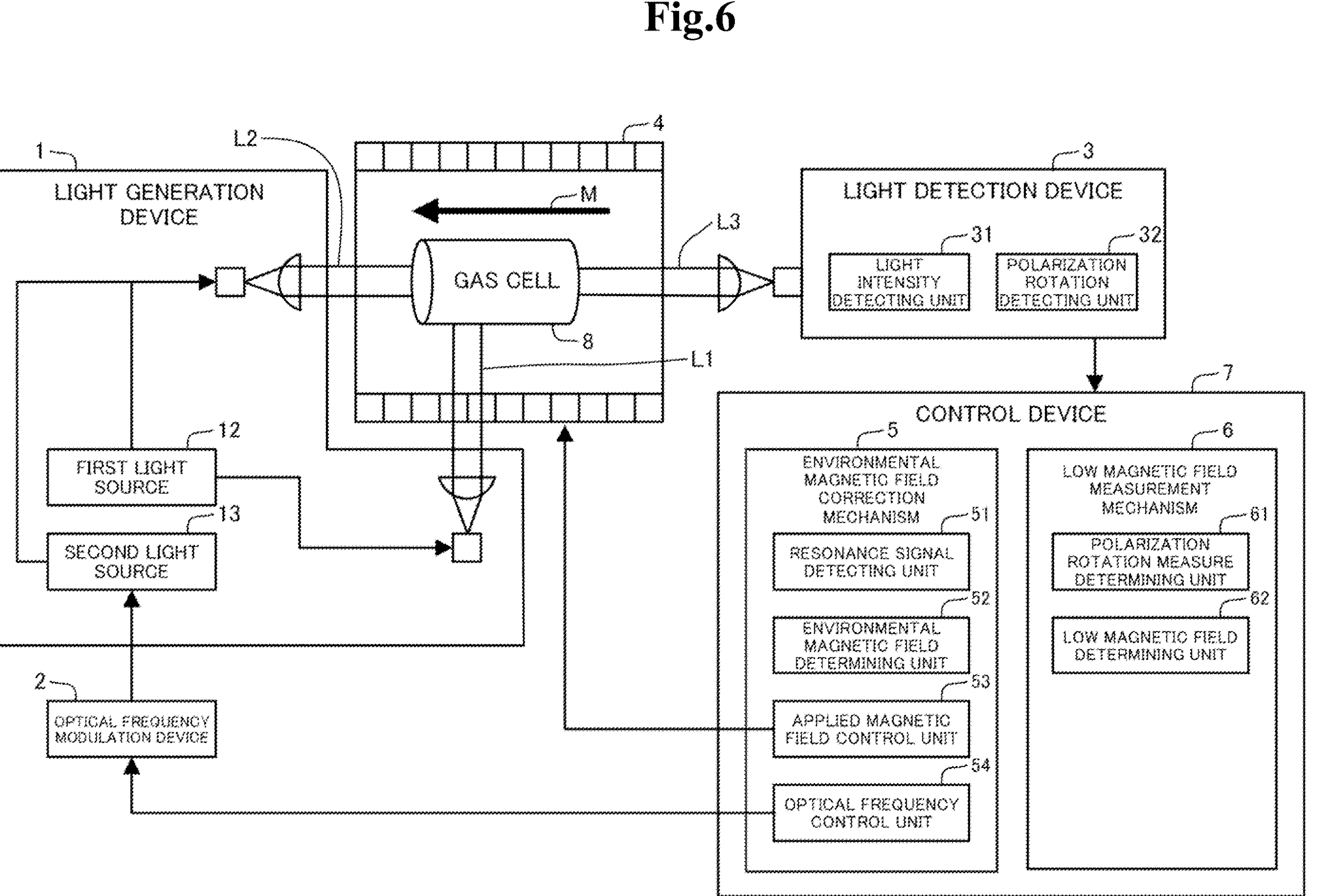
FIG. 6 is a view showing a configuration of a magnetic field measurement apparatus in a second example embodiment.

As shown in FIG. 6, the magnetic field measurement apparatus in this example embodiment includes a first light source 12, and a second light source 13 that can be modulated by the optical frequency modulation device 2, instead of the light source unit 11 described in the first example embodiment. Since the first light source 12 and the second light source 13 generate radiation light containing only two frequencies involved in a quantum interference effect constituting radiation light necessary for observing the quantum interference effect, it is possible to suppress variation in resonance frequency due to an optical electric field that is not involved in a quantum interference effect, and to detect variation in resonance frequency resulting from the magnetic field at the gas cell position with high accuracy. Accordingly, it is possible to provide a magnetic field measurement apparatus capable of measuring a magnetic field even when there is a disturbance magnetic field with a strength exceeding the operable range of an optically pumped magnetometer. For clarity of explanation, the following descriptions and drawings are properly omitted and simplified. Moreover, in each drawing, the same elements are denoted by the same reference numerals, and redundant description is omitted as necessary.

Specifically, the magnetic field measurement apparatus in this example embodiment includes the light generation device 1, the optical frequency modulation device 2, the light detection device 3, the magnetic field application device 4, the control device 7 that controls the environmental magnetic field correction mechanism 5 and the low magnetic field measurement mechanism 6, and the gas cell 8 in which alkali metal atoms are encapsulated in a gaseous state. Since the light detection device 3, the magnetic field application device 4, the control device 7, and the gas cell 8 are substantially the same as those of the first example embodiment, a description thereof will be omitted.

The light generation device 1 is configured to generate pump light L1 containing circular polarization and probe light L2 containing linear polarization. These lights take optical paths so as to be radiated to the gas cell 8. The light generation device 1 includes the first light source 12, and the second light source 13 that can modulate frequency using the optical frequency modulation device 2. The first light source 12 may be stabilized, for example, by locking to the absorption line of the alkali metal atom so that oscillation frequency matches the absorption line. The pump light L1 and the probe light L2 required for the operation of the optically pumped magnetometer can be realized, for example, by conveying the light emitted from the first light source 12, transmitting the light through a proper optical element such as a wave plate, and controlling the polarization state. Moreover, by modulating the frequency of the light emitted from the second light source 13 using the optical frequency modulation device 2 and merging with the light emitted from the first light source 12, the radiation light necessary to observe a quantum interference effect is realized.

The optical frequency modulation device 2 modulates the frequency of the light emitted from the second light source 13. The optical frequency modulation on the second light source 13 is realized, for example, by modulating based on an interference wave with the light emitted from the first light source 12. The difference frequency of the radiation light is controlled within a range in which CPT resonances to be a reference for magnetic field evaluation can be detected. The control range of the difference frequency of the radiation light required here varies in accordance with the strength of a magnetic field at the gas cell position. For example, in a case where (1, 1) resonance and (−1, −1) resonance are used as CPT resonances to be the reference for magnetic field evaluation, the difference in resonance frequency varies in substantially proportional to the strength of a magnetic field at the gas cell position as shown in FIG. 3. As an example, in a case where the strength of a magnetic field at the gas cell position is expected to be approximately 100 μT, it is preferable to provide a mechanism that can control the difference frequency in the radiation light in a range of 1400 kHz or more, for example, approximately 1500 kHz.

[Operation]

Figure 7:
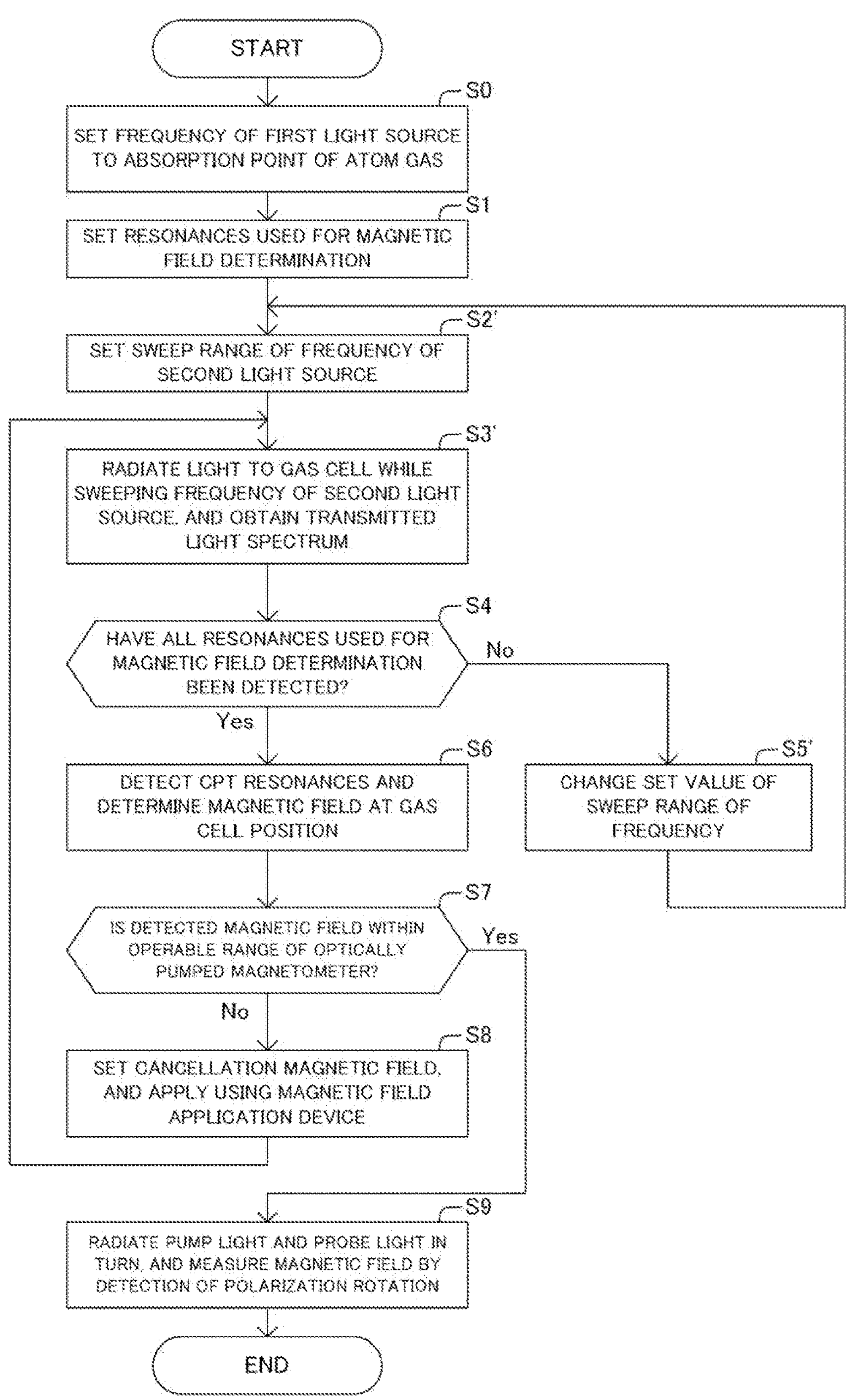
FIG. 7 is a flowchart showing operation of the magnetic field measurement apparatus in the second example embodiment.

FIG. 7 is a flowchart showing the operation of a magnetic field measurement apparatus in the second example embodiment. The flowchart shown in FIG. 7 shows a magnetic field measurement method executed by the magnetic field measurement apparatus in the second example embodiment. The operation in this example embodiment will be described along the flowchart of FIG. 7. In the flowchart of FIG. 7, the same operations as the operations in the flowchart of FIG. 5 described in the first example embodiment will be denoted by the same step numbers.

First, the frequency of the light emitted by the first light source 12 is set so as to match the absorption point of the atom gas encapsulated in the gas cell 8 (step S0). For example, by radiating the light emitted by the first light source 12 to a reference gas cell and controlling so that absorption of the reference gas cell is maximized, the frequency of the light emitted by the first light source 12 may be stabilized so as to match the absorption point of the atom gas encapsulated in the gas cell 8.

At the time of detection of a quantum interference effect, the magnetic field measurement apparatus multiplexes the light emitted by the first light source 12 and the light emitted by the second light source to obtain the radiation light L2, and detects the transmitted light L3 while sweeping the frequency of the second light source 13. Then, first, the magnetic field measurement apparatus sets CPT resonances to be used for magnetic field evaluation (step S1). The magnetic field measurement apparatus stores the amounts of variations of resonance frequencies of these CPT resonances due to the magnetic field into an environmental magnetic field determining unit of the control device 7. At least two CPT resonances such that variations of the resonance frequencies with respect to the magnetic field are known can be selected as the resonances used for magnetic field evaluation. For example, in the case of radiating circularly polarized radiation light, it is possible to select (1, 1) resonance and (−1, −1) resonance. On the other hand, for example, in the case of radiating linearly polarized radiation light, it is possible to select (0, 2) resonance and (−2, 0) resonance.

Subsequently, the sweep range of the frequency of the second light source 13 is set to a predetermined value (step S2'). Preferably, the difference frequency between the first light source 12 and the second light source 13 is set in a range expected to include the resonance frequencies of all the resonances to be used for magnetic field evaluation. As an example, in a case where (1, 1) resonance and (−1, −1) resonance are selected as the resonances to be used for magnetic field evaluation, the difference of these resonance frequencies is, as shown in FIG. 3, 14×B (kHz), where B (μT) is the strength of a magnetic field parallel to the incident direction of the radiation light at the alkali atom position. The sweep range of the difference frequency of the radiation light is set to a wider range than the difference between (1, 1) resonance frequency and (−1, −1) resonance frequency. For example, in a case where the strength of the magnetic field at the gas cell position is expected to be approximately 100 μT, the difference between (1, 1) resonance frequency and (−1, −1) resonance frequency is expected to be approximately 1400 kHz, so that it is preferable to set the sweep range of the difference frequency of the radiation light to 1400 kHz or more.

Under this condition, the light is made to enter the gas cell 8 while the frequency of the second light source 13 is being swept, and the transmitted light is detected by the light detection device 3. Then, the detected transmitted light spectrum is acquired by the environmental magnetic field correction mechanism 5 of the control device 7 (step S3'). At this time, CPT resonances are detected by the resonance signal detecting unit 51 of the environmental magnetic field correction mechanism 5. Here, it is determined whether all the resonances used for magnetic field evaluation have been detected from the measured transmitted light spectrum (step S4).

When there is a CPT resonance having not been detected (No at step S4), the sweep range of the frequency of the second light source 13 is changed to a range where all the CPT resonances are expected to be detected (step S5'). As an example, the sweep range of the frequency of the second light source 13 is expanded. Alternately, as an example, the sweep range of the frequency of the second light source 13 may be shifted to the lower frequency side or the higher frequency side. Then, the processing flow returns to S2'. Specifically, the sweep range of the frequency of the second light source 13 is changed, and measurement of a transmitted light spectrum is performed again.

On the other hand, when all the CPT resonances have been detected (Yes at step S4), a magnetic field value at a predetermined position inside the gas cell 8 is determined based on the difference of the resonance frequencies of the resonances used for magnetic field evaluation by the environmental magnetic field determining unit 52 of the environmental electric field correction mechanism 5 (step S6). As an example, in a case where (1, 1) resonance and (−1, −1) resonance are selected as the resonances used for magnetic field evaluation, the difference of the resonance frequencies of these resonances varies with the magnetic field as shown in FIG. 3. Assuming that the difference of these resonance frequencies is Δf (Hz), a magnetic field value at the position of the gas cell 8 is determined to be Δf/1400 (μT). Here, it is determined whether or not the determined magnetic field value is within the operable range of the pumped light magnetometer (step S7).

In a case where the determined magnetic field value at the position of the gas cell 8 is outside the operable range (No at step S7), the strength of a magnetic field to be applied as a canceling magnetic field is set, and the set value of the magnetic field application device 4 is regulated by the applied magnetic field control unit 53 (step S8). For example, in a case where the determined magnetic field value is beyond the operable range, an applied magnetic field for cancelling the magnetic field value is set. The regulation of the applied magnetic field at the position of the gas cell 8 is realized by changing the value of an electric current applied to the solenoid coil. Then, the processing flow is returned to S3', and measurement of a transmitted light spectrum is performed again.

On the other hand, in a case where the determined magnetic field value at the predetermined position inside the gas cell 8 is within the operable range (Yes at step S7), the regulation of the magnetic field correction mechanism based on observation of a quantum interference effect is ended. Then, by conveying the light emitted from the first light source 12 and radiating the pump light and the probe light in turn, the low magnetic field measurement mechanism 6 measures the rotation of the plane of polarization and determines the strength of a low magnetic field based on the rotation measure of the plane of polarization (step S9). At this time, the low magnetic field determining unit 62 determines a magnetic field value at a predetermined position inside the gas cell 8 based on the strength of the applied magnetic field set by the applied magnetic field control unit 53 and the strength of the low magnetic field determined by the lo magnetic field determining unit 62.

As described above, with the magnetic field measurement apparatus in the second example embodiment, by generating an applied magnetic field regulated by the above method at the position of the gas cell 8, it is possible to implement a magnetic field measurement apparatus that can measure a magnetic field even when there is a disturbance magnetic field with a strength exceeding the operable range of the optically pumped magnetometer. Moreover, since radiation light containing only two frequencies involved in a quantum interference effect composing radiation light necessary for observation of a quantum interference effect can be generated by the first light source 12 and the light source 13 that can be modulated by the optical frequency modulation device 2, it is possible to suppress variations of resonance frequencies due to an optical electric field not involved in a quantum interference effect, and detect the variations of resonance frequencies resulting from a magnetic field at the gas cell position with high accuracy. Consequently, it is possible to provide a magnetic measurement device that can perform magnetic field measurement even if there is a disturbance magnetic field with an intensity exceeding the operable range of the optically pumped magnetometer.

Third Example Embodiment

Figure 8:
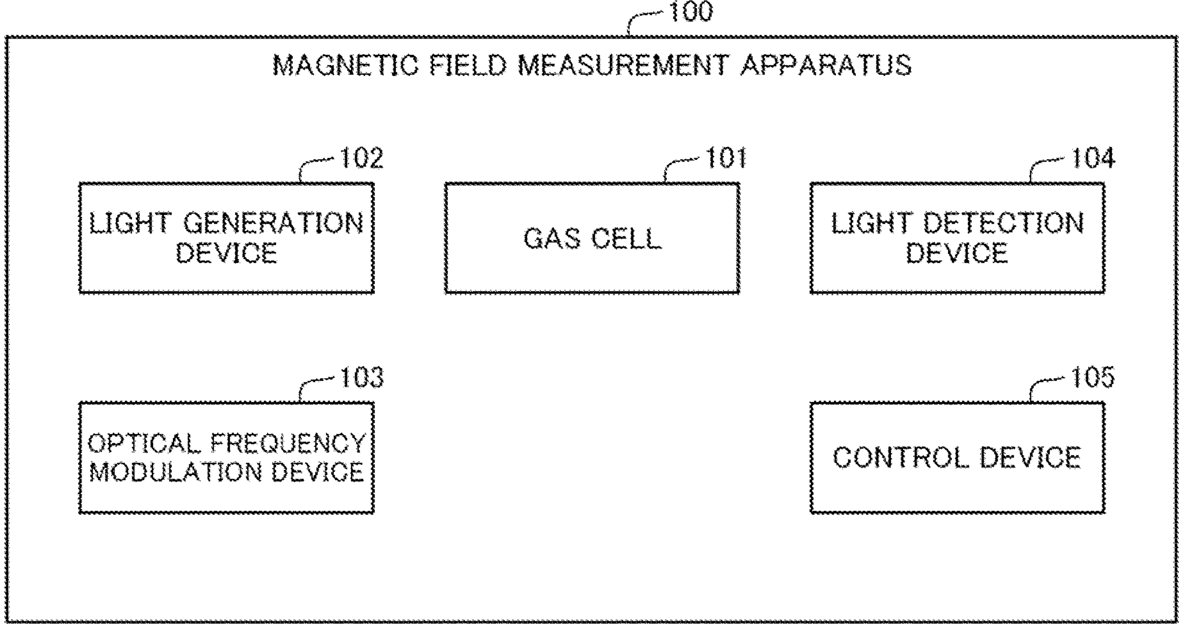
FIG. 8 is a block diagram showing a configuration of a magnetic field measurement apparatus in a third example embodiment of the present invention.

Next, a third example embodiment of the present invention will be described with reference to FIG. 8. FIG. 8 is a block diagram showing a configuration of a magnetic field measurement apparatus in the third example embodiment. In this example embodiment, the overview of the configuration of the magnetic field measurement apparatus described in the above example embodiment is shown.

As shown in FIG. 8, a magnetic field measurement apparatus 100 in this example embodiment includes a gas cell 101 in which alkali metal atoms are encapsulated, a light generation device 102 that generates light to be radiated to the gas cell while controlling a polarization state thereof, an optical frequency modulation device 103 that modulates a frequency of the light generated by the light generation device, a light detection device 104 that measures an intensity and a polarization state of light transmitted through the gas cell, and a control device 105 that determines a magnetic field value at a predetermined position inside the gas cell based on the intensity of the light and the polarization state of the light measured by the light detection device.

Then, the control device 105 with the above configuration measures the intensity of the transmitted light of the light frequency-modulated and radiated to the gas cell 101, and determines the magnetic field value at the predetermined position inside the gas cell 101 based on the intensity. The control device 105 also measures the polarization state of the transmitted light of the light radiated to the gas cell 101 with the polarization state being controlled, and determines the magnetic field value at the predetermined position inside the gas cell 101 based on the polarization state. Consequently, it is possible to measure a low magnetic field by an optically pumped magnetometer based on the polarization state of light, and it is also possible to measure a magnetic field based on the intensity of frequency-modulated light even if there is a disturbance magnetic field with a strength exceeding the operable range of the optically pumped magnetometer.

Although the present disclosure has been described above with reference to the above example embodiments, the present disclosure is not limited to the above example embodiments. The configuration of the present disclosure can be changed in various manners that can be understood by one skilled in the art within the scope of the present disclosure.

SUPPLEMENTARY NOTES

The whole or part of the example embodiments disclosed above can be described as the following supplementary notes. Below, the overview of the configurations of a magnetic field measurement apparatus and a magnetic field measurement method according to the present disclosure will be described. However, the present invention is not limited to the following configurations (Supplementary Note 1)

A magnetic field measurement apparatus comprising:

a gas cell in which an alkali metal atom is encapsulated;

a light generation device configured to generate light to be radiated to the gas cell while controlling a polarization state thereof;

an optical frequency modulation device configured to modulate a frequency of the light generated by the light generation device;

a light detection device configured to measure an intensity and a polarization state of light transmitted through the gas cell; and a control device configured to determine a magnetic field value at a predetermined position inside the gas cell based on each of the intensity of the light and the polarization state of the light measured by the light detection device.

(Supplementary Note 2)

The magnetic field measurement apparatus according to Supplementary Note 1, wherein:

the optical frequency modulation device is configured to modulate the frequency of the light so that light containing at least two frequencies is radiated from the light generation device to the gas cell; and the control device is configured to, based on the intensity of the light, detect a quantum interference state occurring in the alkali metal atom through radiation of the light containing at least two frequencies to the gas cell and determine the magnetic field value at the predetermined position inside the gas cell based on a resonance frequency of the quantum interference state.

(Supplementary Note 3)

The magnetic field measurement apparatus according to Supplementary Note 1 or 2, comprising a magnetic field application device configured to apply a magnetic field to an inside of the gas cell, wherein the control device is configured to control a strength of the magnetic field applied by the magnetic field application device in accordance with the magnetic field value determined based on the intensity of the light.

(Supplementary Note 4)

The magnetic field measurement apparatus according to Supplementary Note 3, wherein the control device is configured to control the strength of the magnetic field applied by the magnetic field application device so as to weaken a magnetic field at a position of the gas cell in accordance with the magnetic field value determined based on the intensity of the light.

(Supplementary Note 5)

The magnetic field measurement apparatus according to any of Supplementary Notes 1 to 4, wherein the control device is configured to, after determining the magnetic field value based on the intensity of the light, determine the magnetic field value based on the polarization state of the light in accordance with the determined magnetic field value.

(Supplementary Note 6)

The magnetic field measurement apparatus according to Supplementary Note 3 or 4, wherein the control device is configured to determine the magnetic field value based on the intensity of the light, control the strength of the magnetic field applied by the magnetic field application device in accordance with the determined magnetic field value, and thereafter determine the magnetic field value based on the polarization state of the light.

(Supplementary Note 7)

The magnetic field measurement apparatus according to Supplementary Note 3, 4 or 6, wherein:

the light generation device is configured to radiate light containing circular polarization and light containing linear polarization; and the control device is configured to, after controlling the strength of the magnetic field applied by the magnetic field application device, determine the magnetic field value at the predetermined position inside the gas cell based on the polarization state of the light measured by the light detection device after radiation of the light containing linear polarization to an excited atom occurring due to radiation of the light containing circular polarization to the gas cell.

(Supplementary Note 8)

The magnetic field measurement apparatus according to Supplementary Note 3, 4, 6 or 7 wherein the control device is configured to determine the magnetic field value at the predetermined position inside the gas cell based on a control value of the strength of the magnetic field applied by the magnetic field application device and the magnetic field value determined based on the polarization state of the light.

(Supplementary Note 9)

The magnetic field measurement apparatus according to any of Supplementary Notes 1 to 8, wherein the light generation device includes a light source whose frequency matches an absorption line of the atom encapsulated in the gas cell and a light source whose frequency can be modulated by the optical frequency modulation device.

(Supplementary Note 10)

A magnetic field measurement method by a magnetic field measurement apparatus that includes a gas cell in which an alkali metal atom is encapsulated, a light generation device configured to generate light to be radiated to the gas cell while controlling a polarization state thereof, an optical frequency modulation device configured to modulate a frequency of the light generated by the light generation device, and a light detection device configured to measure an intensity and a polarization state of light transmitted through the gas cell, the magnetic field measurement method comprising determining a magnetic field value at a predetermined position inside the gas cell based on each of the intensity of the light and the polarization state of the light measured by the light detection device.

(Supplementary Note 11)

The magnetic field measurement method according to Supplementary Note 10, wherein the optical frequency modulation device is configured to modulate the frequency of the light so that light containing at least two frequencies is radiated from the light generation device to the gas cell, the magnetic field measurement method comprising based on the intensity of the light, detecting a quantum interference state occurring in the alkali metal atom through radiation of the light containing at least two frequencies to the gas cell and determining the magnetic field value at the position of the gas cell based on a resonance frequency of the quantum interference state.

(Supplementary Note 12)

The magnetic field measurement method according to Supplementary Note 10 or 11, wherein the magnetic field measurement device further includes a magnetic field application device configured to apply a magnetic field to an inside of the gas cell, the magnetic field measurement method comprising controlling a strength of the magnetic field applied by the magnetic field application device in accordance with the magnetic field value determined based on the intensity of the light.

(Supplementary Note 13)

The magnetic field measurement method according to any of Supplementary Notes 10 to 12, comprising after determining the magnetic field value based on the intensity of the light, determining the magnetic field value based on the polarization state of the light in accordance with the determined magnetic field value.

(Supplementary Note 14)

The magnetic field measurement method according to Supplementary Note 12, comprising determining the magnetic field value based on the intensity of the light, controlling the strength of the magnetic field applied by the magnetic field application device in accordance with the determined magnetic field value, and thereafter determining the magnetic field value based on the polarization state of the light.

(Supplementary Note 15)

The magnetic field measurement method according to Supplementary Note 12 or 14, wherein the light generation device is configured to radiate light containing circular polarization and light containing linear polarization, the magnetic field measurement method comprising after controlling the strength of the magnetic field applied by the magnetic field application device, determining the magnetic field value at the predetermined position inside the gas cell based on the polarization state of the light measured by the light detection device after radiation of the light containing linear polarization to an excited atom occurring due to radiation of the light containing circular polarization to the gas cell.

(Supplementary Note 16)

The magnetic field measurement method according to Supplementary Note 12, 14 or 15 comprising calculating the magnetic field value at the predetermined position inside the gas cell based on a control value of the strength of the magnetic field applied by the magnetic field application device and the magnetic field value determined based on the polarization state of the light.

DESCRIPTION OF REFERENCE NUMERALS

1 light generation device
11 light source unit
12 first light source
13 second light source
2 optical frequency modulation device
3 light detection device
31 light intensity detecting unit
32 polarization rotation detecting unit
4 magnetic field application device
5 environmental magnetic field correction mechanism
51 resonance signal detecting unit
52 environmental magnetic field determining unit
53 applied magnetic field control unit
54 optical frequency control unit
6 low magnetic field measurement mechanism
61 polarization rotation measure determining unit
62 low magnetic field determining unit
7 control device
8 gas cell
100 magnetic field measurement apparatus
101 gas cell
102 light generation device
103 optical frequency modulation device
104 light detection device
105 control device

The invention claimed is:

1. A magnetic field measurement apparatus comprising:

a gas cell in which an alkali metal atom is encapsulated;

a light generation device configured to generate light to be radiated to the gas cell while controlling a polarization state thereof;

an optical frequency modulation device configured to modulate a frequency of the light generated by the light generation device;

a light detection device configured to measure an intensity and a polarization state of light transmitted through the gas cell; and a control device configured to determine a magnetic field value at a predetermined position inside the gas cell based on the intensity of the light measured by the light detection device and after that determine a magnetic field value based on a polarization state of the light in accordance with the determined magnetic field value based on the intensity of the light.

2. The magnetic field measurement apparatus according to claim 1, wherein:

the optical frequency modulation device is configured to modulate the frequency of the light so that light containing at least two frequencies is radiated from the light generation device to the gas cell; and the control device is configured to, based on the intensity of the light, detect a quantum interference state occurring in the alkali metal atom through radiation of the light containing at least two frequencies to the gas cell and determine the magnetic field value at the predetermined position inside the gas cell based on a detected resonance frequency of the quantum interference state based on the intensity of the light.

3. The magnetic field measurement apparatus according to claim 1, comprising a magnetic field application device configured to apply a magnetic field to an inside of the gas cell, wherein the control device is configured to control a strength of the magnetic field applied by the magnetic field application device in accordance with the magnetic field value determined based on the intensity of the light.

4. The magnetic field measurement apparatus according to claim 3, wherein the control device is configured to control the strength of the magnetic field applied by the magnetic field application device so as to weaken a magnetic field at a position of the gas cell in accordance with the magnetic field value determined based on the intensity of the light.

5. The magnetic field measurement apparatus according to claim 3, wherein the control device is configured to determine the magnetic field value based on the intensity of the light, control the strength of the magnetic field applied by the magnetic field application device in accordance with the determined magnetic field value, and thereafter determine the magnetic field value based on the polarization state of the light.

6. The magnetic field measurement apparatus according to claim 3, wherein:

the light generation device is configured to radiate light containing circular polarization and light containing linear polarization; and the control device is configured to, after controlling the strength of the magnetic field applied by the magnetic field application device, determine the magnetic field value at the predetermined position inside the gas cell based on the polarization state of the light measured by the light detection device after radiation of the light containing linear polarization to an excited atom occurring due to radiation of the light containing circular polarization to the gas cell.

7. The magnetic field measurement apparatus according to claim 3, wherein the control device is configured to determine a magnetic field value at the predetermined position inside the gas cell based on the strength of the magnetic field applied by the controlled magnetic field application device and the magnetic field value determined based on the polarization state of the light.

8. The magnetic field measurement apparatus according to claim 1, wherein the light generation device includes a first light source whose frequency matches an absorption line of the atom encapsulated in the gas cell and a second light source whose frequency can be modulated by the optical frequency modulation device.

9. A magnetic field measurement method by a magnetic field measurement apparatus that includes a gas cell in which an alkali metal atom is encapsulated, a light generation device configured to generate light to be radiated to the gas cell while controlling a polarization state thereof, an optical frequency modulation device configured to modulate a frequency of the light generated by the light generation device, and a light detection device configured to measure an intensity and a polarization state of light transmitted through the gas cell, the magnetic field measurement method comprising:

determining a magnetic field value at a predetermined position inside the gas cell based on the intensity of the light measured by the light detection device and after that determining a magnetic field value based on the polarization state of the light.

10. The magnetic field measurement method according to claim 9, wherein the optical frequency modulation device is configured to modulate the frequency of the light so that light containing at least two frequencies is radiated from the light generation device to the gas cell, the magnetic field measurement method comprising based on the intensity of the light, detecting a quantum interference state occurring in the alkali metal atom through radiation of the light containing at least two frequencies to the gas cell and determining the magnetic field value at the predetermined position of the gas cell based on a detected resonance frequency of the quantum interference state based on the intensity of the light.

11. The magnetic field measurement method according to claim 9, wherein the magnetic field measurement device further includes a magnetic field application device configured to apply a magnetic field to an inside of the gas cell, the magnetic field measurement method comprising controlling a strength of the magnetic field applied by the magnetic field application device in accordance with the magnetic field value determined based on the intensity of the light.

12. The magnetic field measurement method according to claim 11, comprising determining the magnetic field value based on the intensity of the light, controlling the strength of the magnetic field applied by the magnetic field application device in accordance with the determined magnetic field value, and thereafter determining the magnetic field value based on the polarization state of the light.

13. The magnetic field measurement method according to claim 11, wherein the light generation device is configured to radiate light containing circular polarization and light containing linear polarization, the magnetic field measurement method comprising after controlling the strength of the magnetic field applied by the magnetic field application device, determining the magnetic field value at the predetermined position inside the gas cell based on the polarization state of the light measured by the light detection device after radiation of the light containing linear polarization to an excited atom occurring due to radiation of the light containing circular polarization to the gas cell.

14. The magnetic field measurement method according to claim 11, comprising calculating a magnetic field value at the predetermined position inside the gas cell based on the strength of the magnetic field applied by the controlled magnetic field application device and the magnetic field value determined based on the polarization state of the light.

* * * * *